United States Patent
Chao

(10) Patent No.: US 11,652,490 B1
(45) Date of Patent: May 16, 2023

(54) APPARATUS AND METHOD OF ENHANCING LINEARITY AND EXPANDING OUTPUT AMPLITUDE FOR CURRENT-STEERING DIGITAL-TO-ANALOG CONVERTERS (DAC)

(71) Applicant: Yuan-Ju Chao, Cupertino, CA (US)

(72) Inventor: Yuan-Ju Chao, Cupertino, CA (US)

(73) Assignee: Ipgreat Incorporated

( * ) Notice: Subject to any disclaimer, the term of this patent is extended or adjusted under 35 U.S.C. 154(b) by 87 days.

(21) Appl. No.: 17/521,823

(22) Filed: Nov. 8, 2021

(51) Int. Cl.
| | |
|---|---|
| *H03M 1/06* | (2006.01) |
| *H03M 1/74* | (2006.01) |
| *H03M 1/10* | (2006.01) |
| *H03M 1/00* | (2006.01) |
| *H03M 1/76* | (2006.01) |

(52) U.S. Cl.
CPC .......... *H03M 1/0604* (2013.01); *H03M 1/002* (2013.01); *H03M 1/10* (2013.01); *H03M 1/745* (2013.01); *H03M 1/765* (2013.01)

(58) Field of Classification Search
CPC .... H03M 1/0604; H03M 1/002; H03M 1/064; H03M 1/10; H03M 1/765; H03M 1/745
See application file for complete search history.

(56) References Cited

U.S. PATENT DOCUMENTS 8,289,198 B2 * 10/2012 Agarwal ............... H03M 1/002
341/172

* cited by examiner

*Primary Examiner* — Joseph J Lauture
(74) *Attorney, Agent, or Firm* — Power Patent Patent PC; Bao Tran

(57) ABSTRACT

A method of expanding current steering Digital-to-Analog Converter (DAC) output amplitude and enhancing linearity performance. Level shifters with regulated supply and ground voltage are inserted before current source latches. Extra devices and small current are placed between switches and resistor load to enhance the linearity of current steering DAC.

20 Claims, 5 Drawing Sheets

US 11,652,490 B1

APPARATUS AND METHOD OF ENHANCING LINEARITY AND EXPANDING OUTPUT AMPLITUDE FOR CURRENT-STEERING DIGITAL-TO-ANALOG CONVERTERS (DAC)

BACKGROUND

FIG. 1 and FIG. 2 illustrate the current source exemplary structure of current steering Digital-to-Analog Converters (DAC). FIG. 1 is cascoded PFET device P1/P2 with resistor load R1/R2 referring to ground. FIG. 2 is cascoded NFET device N1/N2 with resistor load R1/R2 referring to supply. In this configuration, P1/P2 or N1/N2 forms cascoded current source and P3/P4 or N3/N4 are switches controlled by S1/S1B that determines current I0 flow to OUTN or OUTP depending on S1/S1B values. The latches 101 and 102 sample the input data D/DB and generate S1/S1B at specified time. The current sources operate under AVDD3 analog supply and latches operate under AVDD supply. The number of current sources depends on the resolution and architecture of converters. For example, a N-bit binary DAC has N current sources; a N-bit thermometer DAC has 2 to the power of N current sources.

FIG. 3 illustrates the current source and switch supply/ground with specific input. For latch supply/ground at 1.2V/0V, the latch output S1/S1B is set to 0V and 1.2V, which turns on P3 and shuts off P4, the current is flown into R1 and OUTN. To achieve high linearity performance, P1/P2/P3 essentially need to be in device saturation region. Assuming P1/P2 stay in saturation region given specific supply range, for P3 to be in the saturation region, the maximum output amplitude on OUTN can be derived by the following equations:

$$Vod \leq Vds \quad \text{eq(1)}$$

$$Vgs - Vt \leq Vcm - OUTN \quad \text{eq(2)}$$

$$Vcm - AVSS - Vt \leq Vcm - OUTN \quad \text{eq(3)}$$

$$OUTN \leq Vt + AVSS \quad \text{eq(4)}$$

Equation (4) states that the maximum output amplitude on OUTN is P3 device threshold voltage Vt since AVSS is zero. Higher OUTN decreases P3 device drain to source voltage Vds and presses it into linear region with degraded DAC linearity. Conventionally for 3V analog supply with device threshold voltage 0.8V, the maximum output amplitude of current steering DAC is around 0.8V for single-end configuration and 1.6V in differential configuration. When voltage swing is greater than 1.6V, P3/P4 switch moves into the linear region and DAC linearity such as Spurious-Free Dynamic Range (SFDR) and Third-Order Intermodulation (IM3) performance metrics are deteriorated.

Similarly for FIG. 2 cascoded NFET configuration, the following equation can be derived for switch N3/N4 to stay in the saturation region:

$$Vod \leq Vds \quad \text{eq(5)}$$

$$Vgs - Vt \leq OUTN - Vcm \quad \text{eq(6)}$$

$$AVDD - Vcm - Vt \leq OUTN - Vcm \quad \text{eq(7)}$$

$$AVDD - Vt \leq OUTN \quad \text{eq(8)}$$

$$AVDD3 - OUTN \leq AVDD3 - AVDD + Vt \quad \text{eq(9)}$$

Equation (9) indicates that the maximum output amplitude on OUTN/OUTP is N3 device threshold voltage, supply AVDD3 and AVDD dependent. Lower OUTN decreases N3 device drain to source voltage Vds and presses it into linear region which results in degraded DAC linearity.

SUMMARY

In one aspect, a method of expanding the output amplitude of current steering DAC is disclosed. The maximum output amplitude can be programmed and adjusted as needed. Furthermore, the linearity can be further enhanced with the increased output amplitude.

In another aspect, level shifters with regulated supply and ground are coupled to current source switches to enhance the output amplitude of current steering DAC. The maximum output amplitude of DAC can be programmed by adjusting regulated supply and ground. Extra devices and small amount of current can be inserted between switches and resistor load to further improve the linearity performance. Advantages of the converter include expanded voltage amplitude and superior linearity performance.

A more complete appreciation of the present invention and its improvements can be obtained by reference to the accompanying drawings, which are briefly summarized below, to the following detailed description of illustrative embodiments of the invention, and to the appended claims.

DETAILED DESCRIPTION

Figure 1:
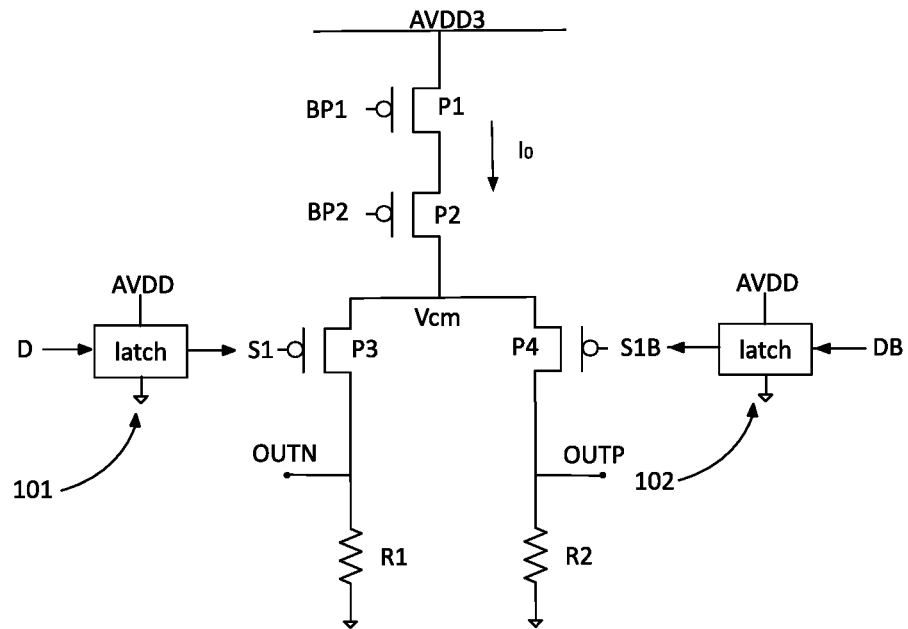
FIG. 1 illustrates conventional current source structure using cascoded PFET.
Figure 2:
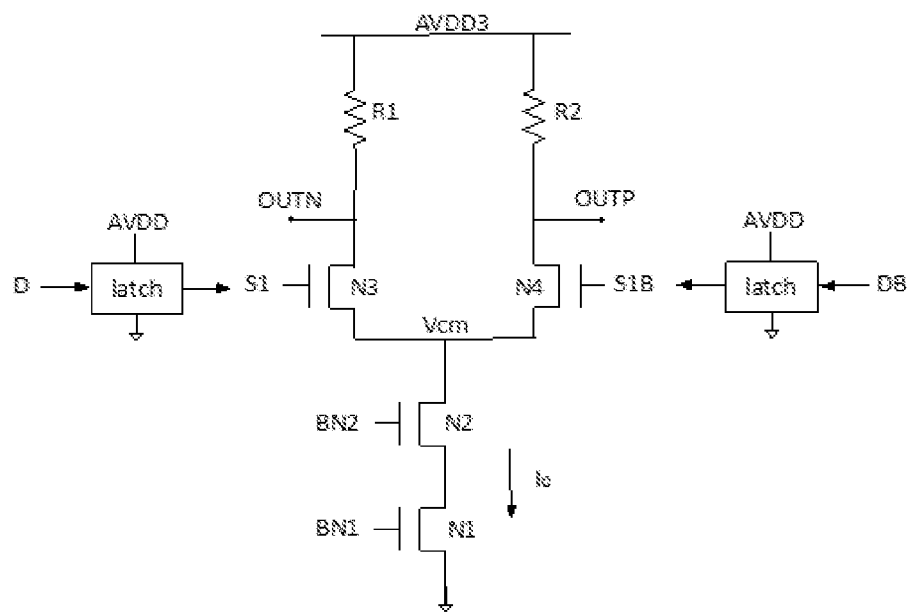
FIG. 2 illustrates conventional current source structure using cascoded NFET.
Figure 3:
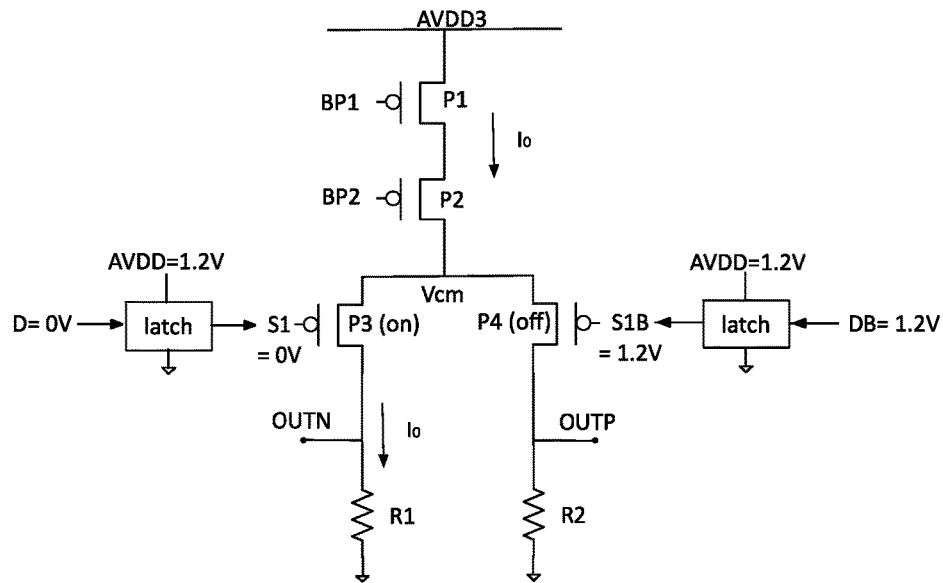
FIG. 3 illustrates the current source and switch supply/ground with specific input.

The present invention will be described with respect to particular embodiments and with reference to certain drawings, but the invention is not limited thereto but only by the claims. The drawings described are only schematic and are non-limiting. In the drawings, the size of some of the elements may be exaggerated and not drawn on scale for illustrative purposes.

The terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Furthermore, it is to be noticed that the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Similarly, it is to be noticed that the term "coupled" discloses both direct and indirect coupling and should not be interpreted as being restricted to direct connections only. Thus, the scope of the expression "a device A coupled to a device B" should not be limited to devices or systems wherein an output of device A is directly connected to an input of device B. It means that there exists a path between an output of A and an input of B which may be a path including other devices or means.

Figure 4:
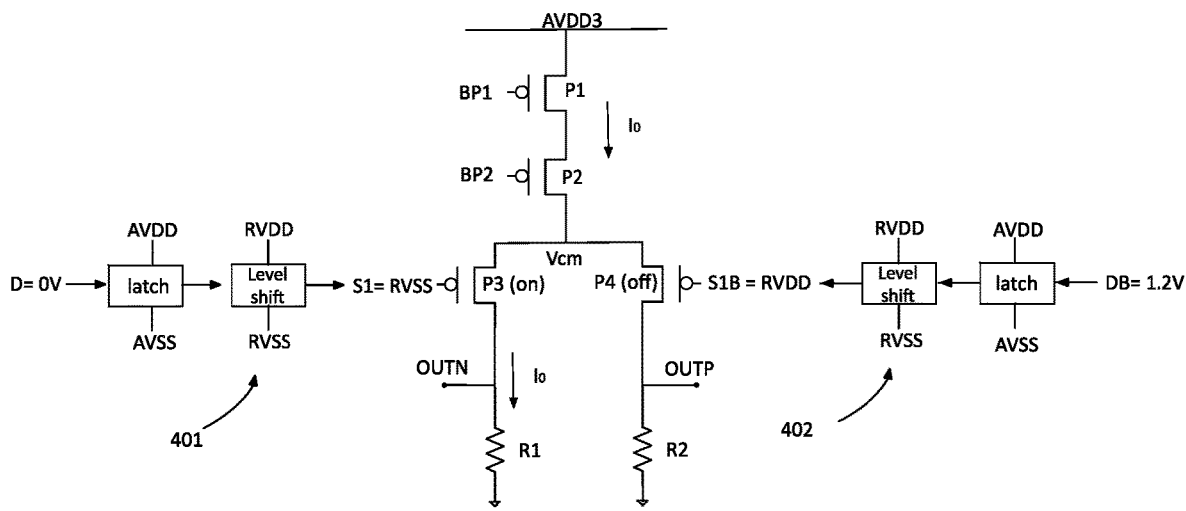
FIG. 4 shows the method of expanding the output amplitude for current steering DAC.

FIG. 4 illustrates the method of expanding the output amplitude for current steering DAC. Two level shifters 401 and 402 are inserted between the latches and P3/P4 switches. The level shifter supply and ground is regulator generated RVDD and RVSS respectively. Similarly to equation (1) to (4), the following equation can be derived for P3 to stay in the saturation region.

$$Vod \leq Vds \qquad \text{eq}(10)$$

$$Vgs-Vt \leq Vcm-OUTN \qquad \text{eq}(11)$$

$$Vcm-RVSS-Vt \leq Vcm-OUTN \qquad \text{eq}(12)$$

$$OUTN \leq Vt+RVSS \qquad \text{eq}(13)$$

Compared with equation (4), OUTN maximum voltage is raised by the amount of (RVSS-AVSS) voltage. The DAC full output range is expanded by 2*(RVSS-AVSS) differentially. Vcm voltage is raised with respect to RVSS which results in more headroom for OUTP/OUTN assuming P1/P2 stay in the saturation region.

Figure 5:
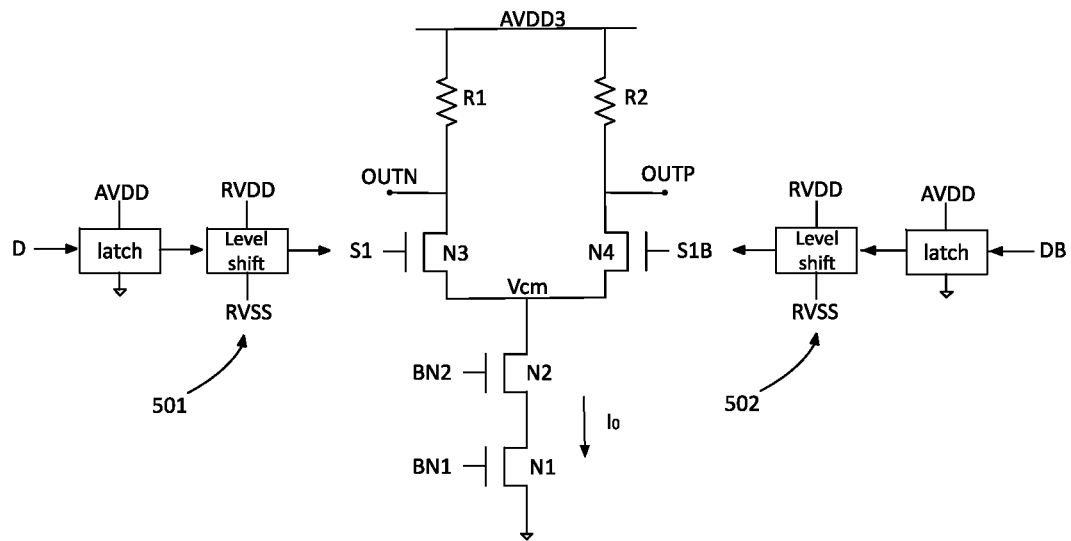
FIG. 5 shows the enhanced output amplitude implementation with cascoded NFET with resistor load referring to supply.

FIG. 5 shows the enhanced output amplitude implementation using cascoded NFET with resistor load referring to supply AVDD3. Level shifter 501 and 502 are inserted between latches and switch N3/N4. S1/S1B signal voltage would be RVDD/RVSS instead of AVDD/AVSS. Assuming input data D/DB is 1/0 respectively; for N3 to stay in saturation region, the following equation is derived:

$$Vod \leq Vds \qquad \text{eq}(14)$$

$$Vgs-Vt \leq OUTN-Vcm \qquad \text{eq}(15)$$

$$RVDD-Vcm-Vt \leq OUTN-Vcm \qquad \text{eq}(16)$$

$$RVDD-Vt \leq OUTN \qquad \text{eq}(17)$$

$$AVDD3-OUTN \leq AVDD3-RVDD+Vt \qquad \text{eq}(18)$$

Compared with equation (9), the expanded voltage amplitude of DAC output is the voltage difference of regulated supply and analog supply (RVDD-AVDD).

Figure 6:
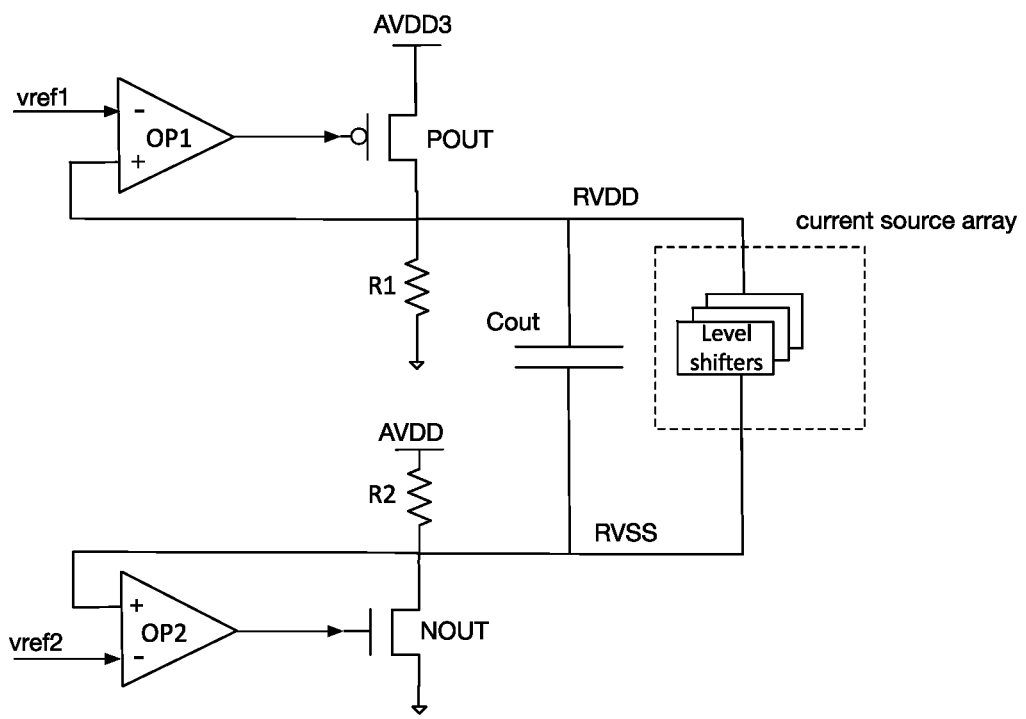
FIG. 6 shows the regulator implementation and the connection to level shifters.

FIG. 6 shows the regulator implementation and the associated connection to level shifters. Two reference voltage vref1/vref2 are fed as inputs of amplifiers OP1 and OP2, which form a closed loop configuration along with output device POUT and NOUT and resistor load R1/R2. The output voltage RVDD and RVSS are employed as the supply and ground of the multiple level shifters in the current source array. A large capacitor Cout is utilized to suppress the voltage ripple of RVDD and RVSS when current source are switching. By setting vref1 and vref2 voltage, RVDD and RVSS voltage can be adjusted; which results in the change of the maximum output swing of DAC.

Figure 7:
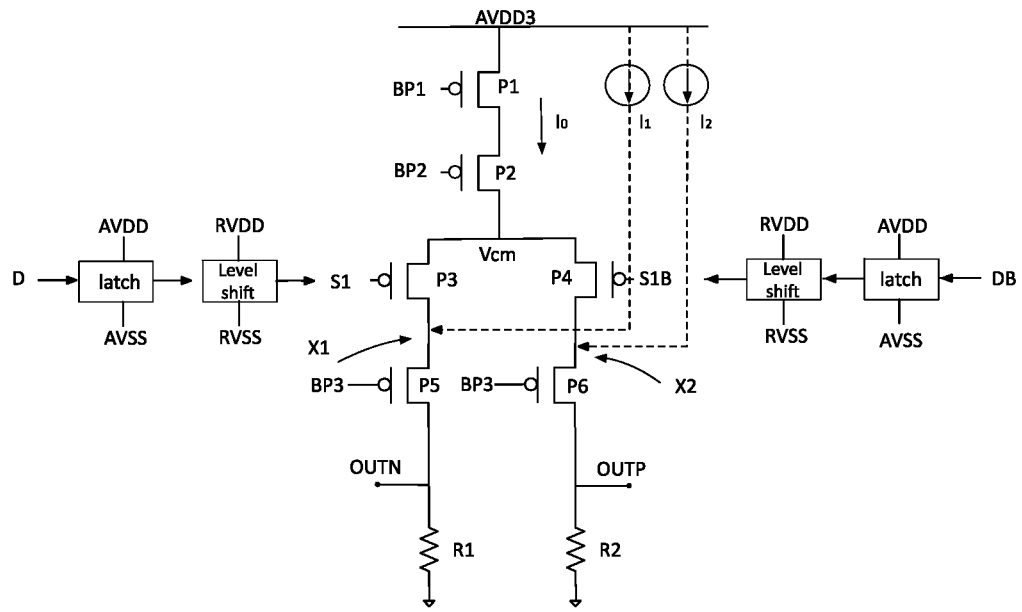
FIG. 7 shows a configuration to further enhance the linearity of expanded output amplitude of current steering DAC.

FIG. 7 illustrates a configuration to further enhance the linearity of expanded output amplitude of current steering DAC. Two PFET P5/P6 are inserted between switches P3/P4 and resistor load R1/R2 then two small current I1/I2 are delivered into node X1 and X2. BP3 is a constant voltage that biases P5 and P6 devices. The small amount of current I1 and I2 flow into P5 and P6 devices respectively and keep P5/P6 always on and stay in the saturation region disregarding the output amplitude of OUTP and OUTN.

Figure 8:
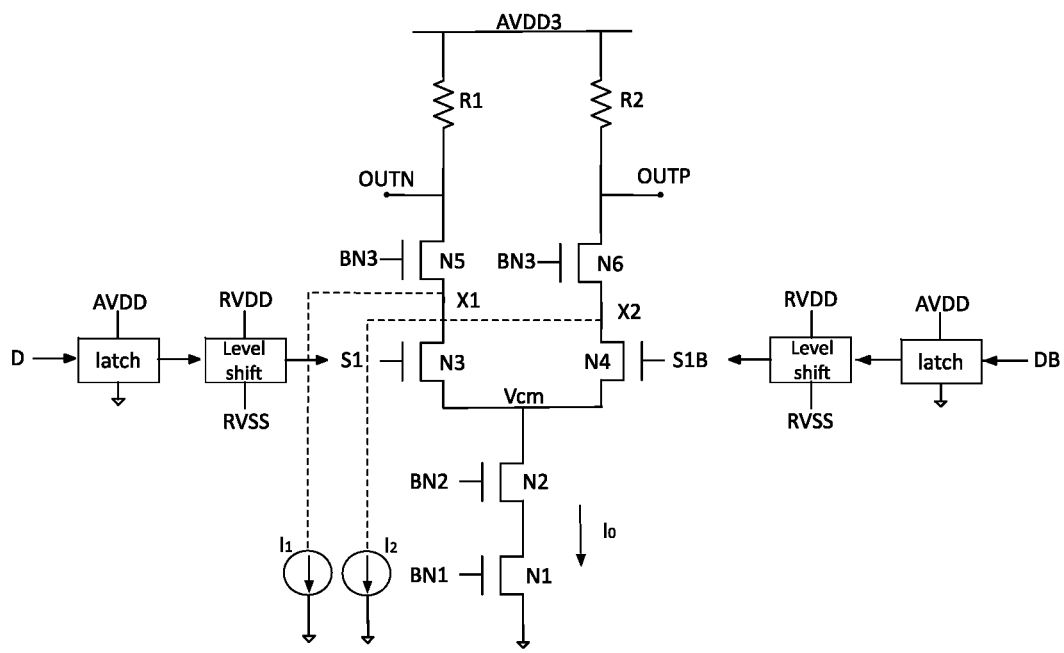
FIG. 8 shows the linearity enhancement configuration using cascoded NFET with resistor load referring to ground.

FIG. 8 illustrates the linearity enhancement configuration using cascaded NFET with resistor load referring to ground. Two NFET N5/N6 are placed between switches N3/N4 and resistor load R1/R2 then two small current I1/I2 are coupled into node X1 and X2. BN3 is constant voltage that biases N5/N6 and keep them always on and stay in the saturation region, this result in superior linearity performance at high output amplitude and high output frequency.

Figure 9:
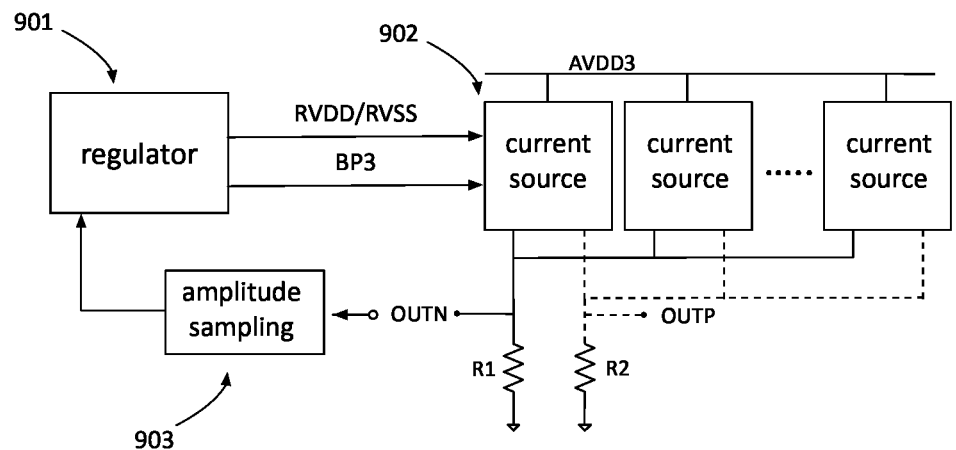
FIG. 9 illustrates a complete PFET current steering DAC with output amplitude correction.

FIG. 9 illustrates a complete PFET current steering DAC with output amplitude correction. It comprises a regulator 901, current source array 902, an amplitude sampling circuit 903. Regulator produces regulated supply/ground RVDD/RVSS and bias voltage BP3 to current source array. Each current source cell is exemplary structure of FIG. 7. All the current source outputs are coupled together to yield current onto resistor load R1/R2. An amplitude sampling circuit detects DAC's maximum output amplitude and feedback the information back to the regulator. This closed loop configuration senses the output and corrects the amplitude by adjusting RVDD/RVSS and bias voltage BP3.

Figure 10:
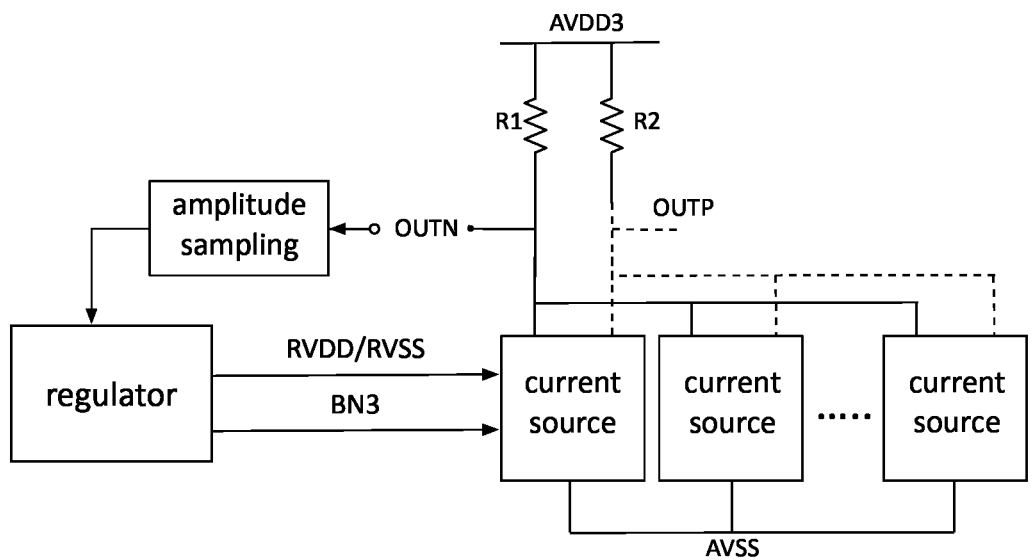
FIG. 10 illustrates a complete NFET current steering DAC with output amplitude correction.

FIG. 10 illustrates similar NFET current steering DAC with output amplitude correction. Regulator produces regulated supply/ground RVDD/RVSS and bias voltage BN3 to current source array. Each current source cell is exemplary structure of FIG. 8. DAC's output voltage is sensed by amplitude sampling circuit and feedback to the regulator. The regulator adjusts regulated RVDD/RVSS and bias voltage BN3 to correct the output amplitude.

What is claimed is:

1. A current steering Digital-to-Analog converter (DAC), comprising:
   a regulator producing regulated supply and ground for level shifters; and
   level shifters inserted between latches and switches, wherein the level shifters are coupled to the regulated supply and ground, wherein an output amplitude of the DAC is expanded to improve a DAC linearity.

2. The converter of claim 1, wherein the current sources comprise cascoded PFET devices with resistor load coupled to ground or cascaded NFET devices with resistor load coupled to a power supply.

3. The converter of claim 1, wherein the input data is provided to latches, and wherein the latches are coupled to level shifters with level shifter outputs coupled to DAC switches.

4. The converter of claim 1, wherein the expanded output amplitude of DAC equals the voltage of subtracting ground from regulated power for the current sources comprising cascoded PFET devices.

5. The converter of claim 1, wherein the expanded output amplitude of the DAC equals the voltage of subtracting analog supply from regulated supply for the current sources comprising cascaded NFET devices.

6. The converter of claim 1, wherein the regulator comprises two reference voltages, two amplifiers together with output devices and resistor loads in closed loop configuration, further comprising a large capacitor between regulated supply and ground to suppress the voltage ripple.

7. The converter of claim 1, wherein the maximum output amplitude of the DAC is programmed by adjusting regulator output regulated supply and ground with respect to a corresponding regulator reference voltage.

8. The converter of claim 1, comprising PFET devices inserted between PFET switches and resistor load to ground and a current is coupled to the PFET devices to enhance linearity of DAC.

9. The converter of claim 1, wherein NFET devices are inserted between NFET switches and resistor load to supply; and a current is coupled to the PFET devices to enhance linearity of DAC.

10. The converter of claim 1, wherein the regulator, a DAC current source array and an amplitude sampling circuit forms a closed feedback loop and wherein the regulator adjusts the regulated supply and ground based on sensed amplitude information to correct a DAC output amplitude.

11. A method of enhancing linearity and output amplitude of current steering Digital-to-Analog converter (DAC) including latches and switches, comprising:
   inserting level shifters between the latches and switches; and
   powering the level shifters with a regulated supply and ground voltage; and
   expanding a voltage amplitude of the DAC with the level shifters; and
   increasing a DAC linearity with the expanded voltage amplitude.

12. The method of claim 11, wherein the current sources comprise cascoded PFET devices with resistor load referring to ground or cascaded NFET devices with resistor load referring to power supply.

13. The method of claim 11, comprising providing input data to the latches, wherein the latches are coupled to level shifters and the level shifters outputs are coupled to DAC switches.

14. The method of claim 11, wherein the expanded output amplitude of DAC equals the voltage of subtracting ground AVSS from regulated RVSS for the current sources comprising cascoded PFET devices.

15. The method of claim 11, wherein the expanded output amplitude of DAC equals the voltage of subtracting analog supply AVDD from regulated supply RVDD for the current sources comprising cascoded NFET devices.

16. The method of claim 11, comprising regulating power with a regulator including two reference voltages, two amplifiers together with output devices and resistor loads in closed loop configuration, and a large capacitor between regulated supply/ground (RVDD/RVSS) is utilized to suppress the voltage ripple.

17. The method of claim 11, wherein the maximum output amplitude of DAC can be programmed by adjusting regulator output regulated supply and ground RVDD/RVSS with respect to the corresponding regulator reference voltage.

18. The method of claim 11, comprising inserting PFET devices between PFET switches and resistor load to ground; and providing a current to the PFET devices to enhance linearity of DAC.

19. The method of claim 11, wherein extra NFET devices are inserted between NFET switches and resistor load to supply; and small current is coupled to the extra PFET devices to enhance linearity of DAC.

20. The method of claim 11, comprising forming a closed feedback loop with a regulator, a DAC current source array and an amplitude sampling circuit, further comprising adjusting the regulated supply and ground based on sensed amplitude information to correct a DAC output amplitude.

\* \* \* \* \*